United States Patent
Hey et al.

(10) Patent No.: US 10,141,167 B2
(45) Date of Patent: Nov. 27, 2018

(54) ION SENSOR

(71) Applicant: Airbus DS GmbH, Taufkirchen (DE)

(72) Inventors: Franz Georg Hey, Constance (DE); Christopher Groll, Gelsenkirchen (DE)

(73) Assignee: Airbus DS GmbH, Taufkirchen (DE)

( * ) Notice: Subject to any disclaimer, the term of this patent is extended or adjusted under 35 U.S.C. 154(b) by 0 days.

(21) Appl. No.: 15/464,800

(22) Filed: Mar. 21, 2017

(65) Prior Publication Data
US 2017/0278683 A1 Sep. 28, 2017

(30) Foreign Application Priority Data
Mar. 22, 2016 (DE) .......................... 10 2016 204 679

(51) Int. Cl.
*H01J 37/32* (2006.01)
*B64F 5/60* (2017.01)

(52) U.S. Cl.
CPC .......... *H01J 37/32935* (2013.01); *B64F 5/60* (2017.01)

(58) Field of Classification Search
CPC .... G01T 1/20; G01T 1/24; G01T 1/28; G01T 1/29; H01J 49/025; H01J 49/0027; H01J 49/0031; H01J 49/0036; H01J 37/32935; B64F 5/60
See application file for complete search history.

(56) References Cited

U.S. PATENT DOCUMENTS

| | | | |
|---|---|---|---|
| 5,223,711 A | 6/1993 | Sanderson et al. | |
| 5,384,465 A * | 1/1995 | Armour | H01J 37/3171 250/305 |
| 5,565,681 A * | 10/1996 | Loewenhardt | H01J 37/05 250/305 |
| 2009/0242791 A1 | 10/2009 | Chen et al. | |
| 2010/0155593 A1 | 6/2010 | Sinclar | |
| 2012/0248310 A1* | 10/2012 | Chen | H01J 37/32935 250/336.1 |
| 2015/0338527 A1* | 11/2015 | Astafieva | H01J 47/02 250/256 |

FOREIGN PATENT DOCUMENTS

JP 10074481 A * 3/1998

OTHER PUBLICATIONS

Van Reijen et al, "High Precision Beam Diagnostics for Ion Thrusters", The 32nd International Electric Propulsion Conference, Wiesbaden, Germany, Sep. 11-15, 2011.*

(Continued)

*Primary Examiner* — David E Smith
(74) *Attorney, Agent, or Firm* — Greer, Burns & Crain, Ltd.

(57) ABSTRACT

An ion sensor comprises an electron repelling electrode to be placed at a negative electric potential, and an ion repelling electrode to be placed at a variable positive electric potential. The electron repelling electrode is formed by a diaphragm element having a diaphragm opening for the passage of an ion beam. The ion repelling electrode forms a blind hole which faces the diaphragm opening with its open hole end and the hole surface of which forms a collector face for detecting impinging ions. With such an ion sensor it is possible, for example, to test the energy spectrum of the ions contained in an exhaust plasma plume of an ion thruster.

20 Claims, 2 Drawing Sheets

(56) References Cited

OTHER PUBLICATIONS

German Search Report, dated Nov. 3, 2016, priority document.
"High Precision Beam Diagnostics for Ion Thruster nu s" by Benjamin van Reijen et al., published in "The 32nd International Electric Propulsion Conference", Sep. 11-15, 2011, Wiesbaden, Germany, IEPC-2011-132.
Bolton Ferda Princeton University, "Retarding Potential Analyzer . . . " Sep. 24, 2015.

\* cited by examiner though the negative electrostatic field. The ion repelling
ION SENSOR

CROSS-REFERENCES TO RELATED APPLICATIONS

This application claims the benefit of the German patent application No. 10 2016 204 679.9 filed on Mar. 22, 2016, the entire disclosures of which are incorporated herein by way of reference.

BACKGROUND OF THE INVENTION

The invention relates to an ion sensor which can be used, for example, for determining the energy spectrum of positively charged ions in a plasma. Such an energy analysis is required, for example, in the testing of ion thrusters in order to be able to obtain information about the efficiency of the thruster.

The ion sensor under consideration here comprises as core components an electron repelling electrode and an ion repelling electrode. The electron repelling electrode is placed at a negative electric potential during operation of the ion sensor, whereby there is formed an electrostatic field which decelerates and finally repels the electrons contained in an inflowing plasma, so that substantially only the positively charged ions contained in the plasma are able to pass through the negative electrostatic field. The ion repelling electrode is, for its part, placed at a positive electric potential, this positive electric potential generally being variable in terms of its strength. Depending on the strength of the positive electrostatic field, ions up to a specific energy are repelled by the field; only ions of sufficiently high energy pass through the barrier formed by the positive electrostatic field. Finally, these ions come into contact with a metallic collector face, where they cause a current flow in the metal material forming the collector face. This electric current can be measured; information about the energy distribution of the ions contained in the plasma can be obtained from the gradient of the current flow, which changes in dependence on the positive potential that is applied.

Ion sensors of this type are referred to in the art as retarding potential analyzers, analyzers which operate with a retarding potential by which first the electrons and then the positively charged ions—in dependence on their energy—are decelerated. In accordance with their barrier function, the electron repelling electrode and the ion repelling electrode are frequently referred to as repellers in the art.

In a conventional type of RPA ion sensor, the repeller electrodes are formed by grids. Another conventional type of RPA ion sensor does not employ grid electrodes. Instead, it uses annular electrodes which, in contrast to a grid, provide only a single through-opening for the plasma components and are therefore also referred to in the art as single orifice RPAs. For a known form of such a single orifice RPA, reference is made to the article "High Precision Beam Diagnostics for Ion Thruster nu s" by Benjamin van Reijen et al., published in "The 32nd International Electric Propulsion Conference", 11-15 Sep. 2011, Wiesbaden, Germany, IEPC-2011-132. The RPA ion sensor described therein has an annular-cylindrical ion repelling electrode behind which there is arranged, at a distance therefrom, a sensor electrode serving as the ion collector. Between the ion repelling electrode and the sensor electrode there is arranged an additional auxiliary electrode, which is to be placed at a negative electric potential and serves on the one hand to focus the ion beam passing through the ion repelling electrode and on the other hand as a repeller for any secondary electrons which may form when the ions come into contact with the sensor electrode.

SUMMARY OF THE INVENTION

An object of the invention is to provide an ion sensor of the RPA type which, with a good signal-to-noise ratio (ratio of the wanted signal to the unwanted signal), is not only, but in particular, also suitable for use in the testing of ion thrusters having propulsive powers in the region of milli- or micro-newtons.

An ion sensor according to the invention comprises an electron repelling electrode which is to be placed at a negative electric potential, an ion repelling electrode which is to be placed at a variable positive electric potential, and a collector face for detecting impinging ions. The electron repelling electrode is formed by a diaphragm element having a diaphragm opening for the passage of an ion beam. According to the invention, the ion repelling electrode forms a blind hole which faces the diaphragm opening with its open hole end and the surface of which forms the collector face. In such an ion sensor, the functions of the ion repeller and of the collector are combined in a common electrode, which simplifies the construction of the sensor. It has been shown that the solution according to the invention allows a sufficiently strong sensor signal with a good signal-to-noise ratio to be obtained with a comparatively small diameter of the diaphragm opening. The small size of the diaphragm opening permits high spatial resolution when the ion sensor is moved transversely through the exhaust plume of an ion thruster.

In a further development, the hole bottom of the blind hole is designed with a depression, for example in the form of a conical funnel. Most of the ions which pass through the barrier formed by the electrostatic field of the ion repelling electrode will come into contact with the hole surface in the region of the hole bottom, although a certain proportion of the ions can also come into contact with the hole surface in the region of the hole lateral wall. When ions come into contact with the hole surface, secondary electrons can be driven out of the material of the ion repelling electrode and pass into the interior of the hole. It has been shown that, when the hole bottom is designed with a depression, the proportion of secondary electrons that move in the blind hole towards the open hole end, and possibly leave the blind hole there, can be kept comparatively small. A comparatively large proportion of the secondary electrons can be kept in the region of the hole bottom because of the depression. The depression-like form of the hole bottom increases the probability that secondary electrons will come into contact with the hole surface (collector face) and there be neutralized. This increases the precision of the current measurement. Secondary electrons which leave the interior of the hole do not contribute towards the measured current and therefore cause a measuring inaccuracy. The smaller the proportion of secondary electrons that leave the blind hole, the better the measuring accuracy.

The funnel angle of the funnel-shaped depression in the hole bottom can be, for example, between 100 and 135° or between 105 and 130° or between 110 and 125° or between 115 and 120°. In some embodiments, this angle is approximately 118°.

The blind hole can have a cylindrical, in particular circular-cylindrical, hole perimeter. Starting from its open hole end, the blind hole can have a constant cross-section at least over a large part of its hole depth reaching to the hole bottom. In other embodiments, it is possible that the hole cross-section changes over the length of the blind hole (that is to say, starting from the open hole end to the hole bottom), for example in one or more steps.

In some embodiments, the blind hole has a maximum hole depth of not less than 15 mm or not less than 18 mm or not less than 21 mm.

In some embodiments, the blind hole has a maximum hole depth of not more than 34 mm or not more than 31 mm or not more than 28 mm.

The ion repelling electrode can be formed by a cup body, the cup height of which is greater than the cup inside diameter, for example at least 1.3 times greater or at least 1.5 times greater or at least 1.7 times greater. The term cup body here denotes a shape of the electrode body, which has a lateral wall which is closed all around and a bottom wall which closes the lateral wall interior on one side and is therefore comparable to a cup or beaker shape. In the following, this shape is referred to using the word component "cup," it also being possible to use the term "beaker" as an alternative.

The invention relates further to the use of an ion sensor of the type described above for testing a plasma. This use comprises the steps: connecting the electron repelling electrode to a source of a negative electric potential, connecting the ion repelling electrode to a source of a variable positive electric potential, introducing the ion sensor into an ion beam, and measuring an electric current tapped at the ion repelling electrode.

BRIEF DESCRIPTION OF THE DRAWINGS

The invention is explained in greater detail below with reference to the accompanying drawings, in which.

DETAILED DESCRIPTION OF THE PREFERRED EMBODIMENTS

Figure 1:
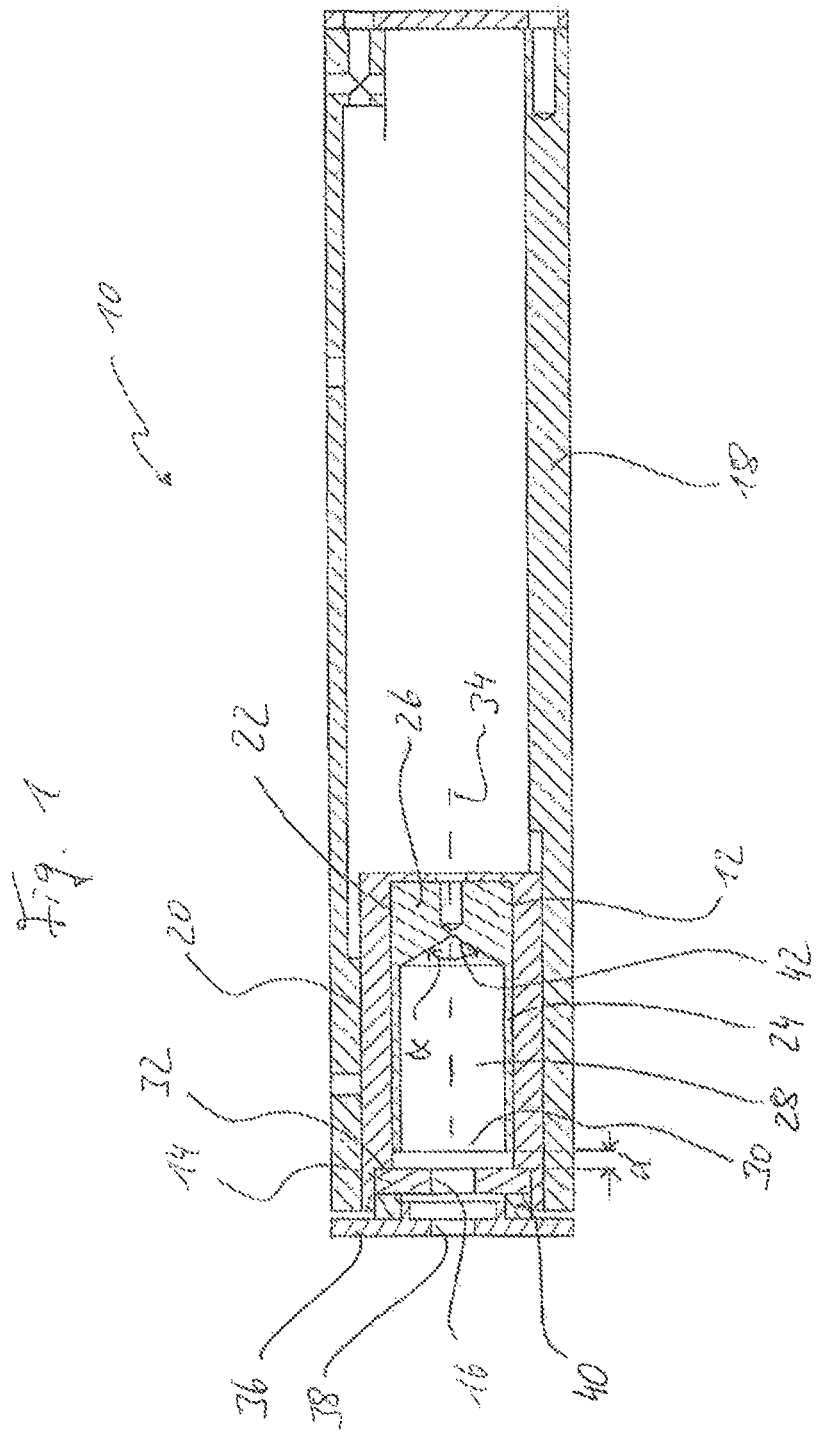
FIG. 1 shows an embodiment of an ion sensor in a longitudinal section.

Reference will first be made to FIG. 1. The ion sensor shown therein is generally designated 10. It comprises, as the fundamental components, a cup electrode 12 serving as the ion repeller and an annular ring electrode 14 serving as the electron repeller, the central ring opening of which forms a diaphragm opening 16 for the passage of an ion beam. The cup electrode 12 at the same time serves as the collector for ions of the ion beam. That is to say, ions come into contact with the surface of the cup electrode 12 and cause an electron flux in the material of the cup electrode 12. This can be measured by means of suitable electric circuitry of the ion sensor 10 (see FIG. 2, which is yet to be described). The cup electrode 12 is made, for example, of a copper material and the annular ring electrode 14 is made, for example, of an aluminum material.

The cup electrode 12 and the annular ring electrode 14 are fitted in a tubular outer housing 18 of the ion sensor 10. This outer housing 18 can be made of a metallic material, for example aluminum. It serves to shield the internal sensor components (including the two electrodes 12, 14) from the surrounding plasma in which the ion sensor 10 is operated.

The cup electrode 12 is seated in the outer housing 18 with the interposition of an insulator body 20, which is likewise cup-shaped. The cup electrode 12 is inserted in the insulator body 20, which in turn is inserted into the outer housing 18 from one tube end thereof and is held therein. The insulator body 20 is made of an electrically insulating material (for example plastics material) and electrically insulates the cup electrode 12 and the annular ring electrode 14 with respect to the outer housing 18. During operation, the outer housing is placed, for example, at the electric ground potential of the electrical measuring circuit to which the ion sensor 10 is connected for measuring operation.

The cup electrode 12 is formed by a cup body 22, which has a cup lateral wall 24, which is circular-cylindrical in the example shown, and a cup bottom 26. The cup interior delimited between the cup lateral wall 24 and the cup bottom 26 defines a blind hole 28, which is closed in the region of its hole bottom (where the cup bottom 26 is situated) and has an open hole end 30 in the region of the cup opening. The cup body 22 is produced, for example, by working the blind hole 28 into a section of a round-rod body from one end, for example by drilling.

The cup body 22 is inserted in the insulating body 20 to the bottom thereof. The insulating body 20 projects slightly beyond the cup lateral wall 24 of the cup body 22 in the region of the open hole end 30 and forms in the projecting region an annular shoulder 32 for the axial abutment of the annular ring electrode 14. Where axial is mentioned herein, this relates to a notional cup central axis 34 of the cup body 22. The annular shoulder 32 ensures a defined axial distance between the annular ring electrode 14 and the cup electrode 12. This distance is designated d in FIG. 1; it is, for example, in a range between 1 mm and 5 mm or between 1 mm and 4 mm or between 1 mm and 3 mm. In some embodiments, the axial distance d is, for example, approximately 2 mm.

Axially in front of the annular ring electrode 14 (that is to say, axially opposite the cup electrode 12), the ion sensor 10 has a cover cap 36 with an inlet opening 38 for the plasma jet to be tested. In the example shown, the inlet opening 38 is identical in terms of cross-section to the diaphragm opening 16 of the annular ring electrode 14, that is to say, it has the same cross-sectional shape and size as the diaphragm opening 16. The cover cap 36 can be made of a metal material, for example aluminum, and can be at an undefined electric potential. "Undefined" means that it is neither connected to an electrical ground nor placed at a defined positive or negative electric potential. For electrically insulating the cover cap 36 from the annular ring electrode 14, a spacer ring 40 is inserted between them, which spacer ring is made of an electrically insulating material, for example polyoxymethylene (POM) or a ceramics material such as, for example, Macor.

The blind hole 28 is designed with a depression 42 in the region of its hole bottom, which depression has the shape of a conical funnel in the example shown. The middle of the funnel is situated in the region of the cup axis 34, that is to say, the cup axis 34 passes through the depression 42 at the deepest point of the funnel. The funnel angle designated α in FIG. 1 is, for example, approximately 118°.

In the ion sensor 10, the entire hole surface inside the blind hole 28 serves as the collector face, with which ions can come into contact. At least a large part of the ions will come into contact with the hole surface in the region of the hole bottom, specifically in the region of the depression 42. The form of the hole bottom with the funnel-like depression is advantageous for ensuring that secondary electrons which can form when the ions come into contact with the material of the cup electrode 12 are not ejected from the blind hole 28. This ensures that the incoming stream of charge carriers (ions) can be measured as completely as possible and the measuring accuracy is correspondingly high.

It is of course possible in a modified embodiment to make the hole bottom completely planar with a bottom face that is orthogonal with respect to the cup axis 34. It is likewise possible to provide the depression 42 with a different shape, for example a rounded shape, instead of with a conical funnel shape. While the depression 42 extends over the entire hole bottom in the example of FIG. 1, it is conceivable in other embodiments that the hole bottom has an axially oriented annular face in its radially outer region and the inside of this annular face is in the form of a depression.

In a practical embodiment of the ion sensor 10, the axial length of the cup lateral wall 24 (corresponding to the hole depth starting from the open hole end 30 to the funnel edge) is, for example, in a range between 15 mm and 30 mm. For example, the axial length of the cup lateral wall 24 is approximately 22 mm. The inside diameter of the cup lateral wall 24 (corresponding to the hole diameter of the blind hole 28) is, for example, in a range between 8 mm and 16 mm or in a range between 10 mm and 14 mm. For example, the hole diameter is approximately 12 mm. The wall thickness of the cup lateral wall 24 can be comparatively small; for example, the cup lateral wall 24 is only approximately 1 mm thick.

The diameter of the (circular) diaphragm opening 16 is, for example, in a range between 3 mm and 8 mm. For example, the diameter of the diaphragm opening 16 is approximately from 5 to 6 mm.

Figure 2:
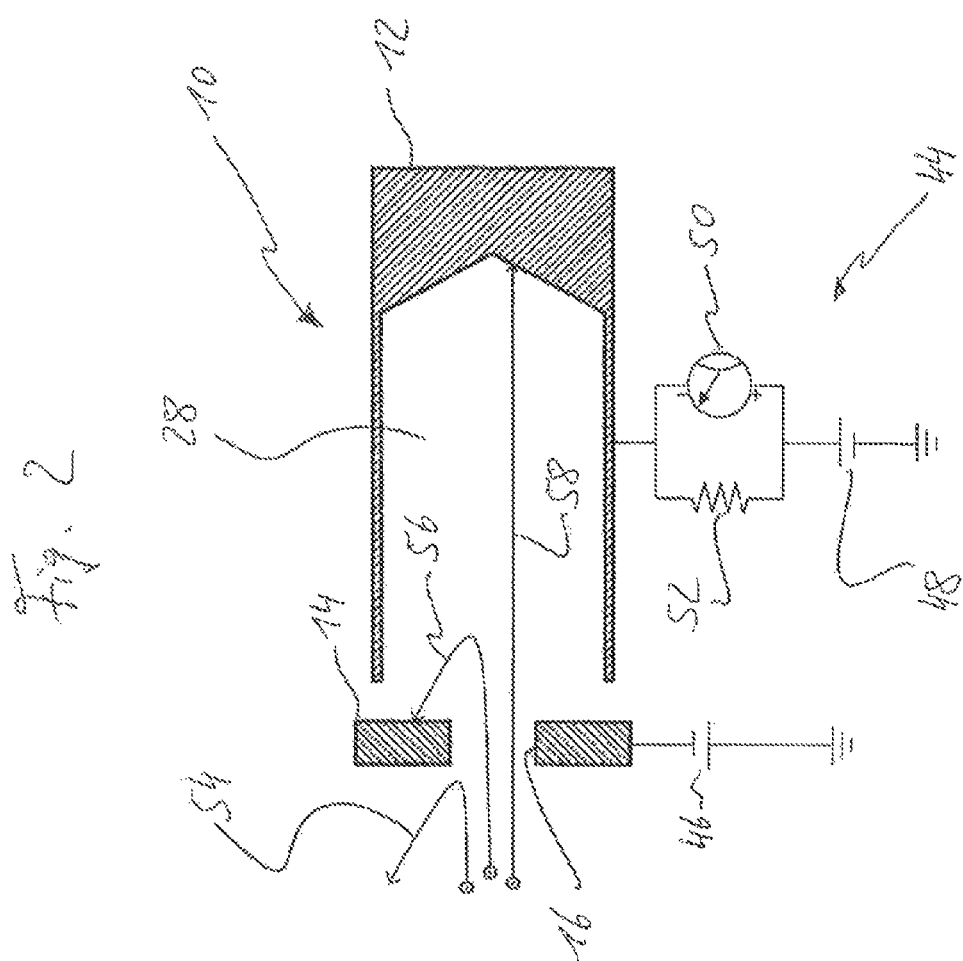
FIG. 2 shows, schematically, the use of the ion sensor of FIG. 1 for testing a plasma jet.

Reference will now additionally be made to FIG. 2. As components of the ion sensor 10, the cup electrode 12 and the annular ring electrode 14 are shown therein. The remaining components of the ion sensor 10 have been omitted for the sake of clarity. Additionally shown in FIG. 2 are components of an electrical measuring circuit 44, which serves to place the two electrodes 12, 14 at defined electric potentials and to measure the electric current which can be tapped at the cup electrode 12 under ion bombardment. The measuring circuit 44 comprises an electric potential source (voltage generator) 46, which provides a constant negative electric potential (negative in relation to a neutral electrical ground potential) for the annular ring electrode 14. This negative potential is, for example, between −10 and −50 V. In a specific example, it is approximately −28 V, for example. The measuring circuit 44 further comprises an electric potential source 48 which provides a positive electric potential of variable strength for the cup electrode 12. In the ion sensor 10, the sensor current is tapped at the cup electrode 12 itself. For measuring the sensor current, a voltmeter 50 is provided, by means of which the voltage at a defined precision resistor 52 can be measured and the current flowing across the resistor 52 can be determined therefrom. In a modified embodiment, the resistor 52 can be replaced by a transimpedance converter.

In operation, the ion sensor 10 is so introduced into a plasma jet to be tested that the jet approaches the diaphragm opening 16 from the left-hand side of the annular ring electrode 14 shown in FIG. 2. Electrons contained in the plasma are repelled by the electrostatic field generated by the annular ring electrode 14 and are unable to pass through the diaphragm opening 16. This is shown in FIG. 2 by a movement arrow 54. Positively charged ions, on the other hand, are able to pass through the diaphragm opening 16. Some of these are repelled by the electrostatic field generated by the cup electrode 12, as is indicated in FIG. 2 by a movement arrow 56. Only ions with sufficiently high energy are able to penetrate the electrostatic field generated by the cup electrode 12 and enter the deep regions of the blind hole 28, which are largely free of field. There they come into contact with the surface of the material of the cup electrode 14 and cause an electric current. A movement arrow 58 illustrates in FIG. 2 by way of example the movement pattern of ions that are able to penetrate the positive electrostatic field of the cup electrode 12. Depending on the level of the positive potential generated by the potential source 48, more or fewer ions, that is to say, ions with higher or lower energy, are able to pass through the barrier formed by the electrostatic field of the cup electrode 12.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An ion sensor comprising:
   an annular electron repelling electrode to be placed at a negative electric potential, wherein the electron repelling electrode is formed by a diaphragm element having a single central circular diaphragm opening for the passage of an ion beam,
   an ion repelling electrode to be placed at a variable positive electric potential, and
   a collector face for detecting impinging ions,
   wherein the ion repelling electrode forms a blind hole which faces the diaphragm opening with an open hole end and a hole surface of which forms the collector face.

2. The ion sensor according to claim 1, wherein the hole bottom of the blind hole is formed with a depression.

3. The ion sensor according to claim 2, wherein the depression is in the form of a conical funnel.

4. The ion sensor according to claim 3, wherein the funnel angle is between 100 and 135 degrees.

5. The ion sensor according to claim 3, wherein the funnel angle is between 105 and 130 degrees.

6. The ion sensor according to claim 3, wherein the funnel angle is between 110 and 125 degrees.

7. The ion sensor according to claim 3, wherein the funnel angle is between 115 and 120 degrees.

8. The ion sensor according to claim 3, wherein the funnel angle is approximately 118 degrees.

9. The ion sensor according to claim 1, wherein the blind hole has a cylindrical hole perimeter.

10. The ion sensor according to claim 9, wherein the cylindrical hole perimeter is circular-cylindrical.

11. The ion sensor according to claim 1, wherein the blind hole has a constant cross-section, starting from the open hole end, at least over a large part of its hole depth reaching to the hole bottom.

12. The ion sensor according to claim 1, wherein the blind hole has a minimum hole depth of not less than 15 mm.

13. The ion sensor according to claim 1, wherein the blind hole has a maximum hole depth of not less than 18 mm.

14. The ion sensor according to claim 1, wherein the blind hole has a maximum hole depth of not less than 21 mm.

15. The ion sensor according to claim 1, wherein the blind hole has a maximum hole depth of not more than 34 mm.

16. The ion sensor according to claim 1, wherein the blind hole has a maximum hole depth of not more than 31 mm.

17. The ion sensor according to claim 1, wherein the blind hole has a maximum hole depth of not more than 28 mm.

18. The ion sensor according to claim 1, wherein the ion repelling electrode is formed by a cup body, the cup height of which is greater than the cup inside diameter.

19. The ion sensor according to claim 18 wherein the cup height is at least 1.3 times greater than the cup inside diameter.

20. A method of using an ion sensor for testing a plasma, the ion sensor comprising:

- an annular electron repelling electrode which is to be placed at a negative electric potential, wherein the electron repelling electrode is formed by a diaphragm element having a single central circular diaphragm opening for the passage of an ion beam,
- an ion repelling electrode which is to be placed at a variable positive electric potential, and
- a collector face for detecting impinging ions,
- wherein the ion repelling electrode forms a blind hole which faces the diaphragm opening with an open hole end and a hole surface of which forms the collector face;

the method comprising the steps:

connecting the electron repelling electrode to a source of a negative electric potential, connecting the ion repelling electrode to a source of a variable positive electric potential, introducing the ion sensor into an ion beam, and measuring an electric current tapped at the ion repelling electrode.

* * * * *